(12) United States Patent
Mizukami

(10) Patent No.: US 8,553,421 B2
(45) Date of Patent: Oct. 8, 2013

(54) FIRE ALARM SYSTEM TRANSMITTER

(75) Inventor: Akira Mizukami, Tokyo (JP)

(73) Assignee: Nohmi Bosai Ltd., Tokyo (JP)

( * ) Notice: Subject to any disclaimer, the term of this patent is extended or adjusted under 35 U.S.C. 154(b) by 189 days.

(21) Appl. No.: 12/881,508

(22) Filed: Sep. 14, 2010

(65) Prior Publication Data
US 2011/0090654 A1    Apr. 21, 2011

(30) Foreign Application Priority Data

Oct. 20, 2009  (JP) .................................. 2009-241416

(51) Int. Cl.
 *H05K 5/00*         (2006.01)
(52) U.S. Cl.
 USPC .......................................... 361/752; 361/730
(58) Field of Classification Search
 USPC .......................... 361/752, 796, 800, 728–730
 See application file for complete search history.

(56) References Cited

U.S. PATENT DOCUMENTS

| | | | |
|---|---|---|---|
| 3,460,069 A * | 8/1969 | Uberbacher et al. .......... | 333/116 |
| 3,668,476 A * | 6/1972 | Wrabel et al. ................ | 361/785 |
| 4,595,248 A * | 6/1986 | Brown ............................ | 439/83 |
| 4,729,740 A * | 3/1988 | Crowe et al. .................. | 439/76.1 |
| 4,912,602 A * | 3/1990 | Zurek et al. ................... | 361/752 |
| 5,253,143 A | 10/1993 | Klinger et al. | |
| 5,411,401 A * | 5/1995 | Chiou .......................... | 439/76.1 |
| 5,655,933 A * | 8/1997 | Skowronski .................. | 439/654 |
| 6,111,760 A * | 8/2000 | Nixon ........................... | 361/814 |
| 6,132,250 A * | 10/2000 | Shinozaki et al. ............ | 439/587 |
| 6,239,986 B1 * | 5/2001 | Otsuka ........................ | 361/796 |
| 6,307,752 B1 * | 10/2001 | Howard et al. ............... | 361/752 |
| 6,757,155 B2 * | 6/2004 | Koike et al. .................. | 361/600 |
| 7,037,139 B1 * | 5/2006 | Stefaniu et al. .............. | 439/660 |
| 7,338,330 B2 * | 3/2008 | Lopez et al. .................. | 439/709 |
| 7,539,026 B2 * | 5/2009 | Finnerty et al. .............. | 361/803 |
| 7,643,297 B2 * | 1/2010 | Tominaga et al. ............ | 361/704 |
| 2004/0242081 A1 * | 12/2004 | Otto et al. ..................... | 439/709 |
| 2008/0278918 A1 | 11/2008 | Tominaga et al. | |

FOREIGN PATENT DOCUMENTS

| | | |
|---|---|---|
| CN | 1255826 | 6/2000 |
| ES | 2 328 863 | 4/2008 |
| GB | 2 454 731 | 5/2009 |
| WO | 91/07865 | 5/1991 |

OTHER PUBLICATIONS

European Search Report issued Jan. 21, 2011 in corresponding European Patent Application No. 10 17 7258.
Mexican Office Action issued Jul. 2, 2012 in corresponding Mexican Patent Application No. MX/a/2010/010452 with partial translation.

* cited by examiner

*Primary Examiner* — Hung S Bui
(74) *Attorney, Agent, or Firm* — Wenderoth, Lind & Ponack, LLP

(57) ABSTRACT

A fire alarm system transmitter includes: a printed circuit board with a substantially rectangular shape, on which a terminal block including a plurality of terminals aligned along one side of the printed circuit board is disposed; a casing with a substantially rectangular parallelepiped shape, in which the printed circuit board is mounted; and an electric-wire insertion portion provided on a side wall of the casing facing the one side, and extended from the side wall by a predetermined distance toward an outside of the casing. The side wall allows a plurality of electric wires connected to the plurality of terminals to be inserted through the side wall.

4 Claims, 5 Drawing Sheets

EXTERNAL
CREEPAGE
DISTANCE

FIRE ALARM SYSTEM TRANSMITTER

BACKGROUND OF THE INVENTION

1. Field of the Invention

The present invention relates to a fire alarm system transmitter for use in a fire alarm system.

2. Description of the Related Art

In a transmitter for use in a fire alarm system, a printed circuit board on which a terminal block is fixed is housed inside the transmitter. In an operation of mounting the transmitter to a mounting box, an electric wire extended to an inside of the mounting box is connected to the terminal block, and then, the transmitter is arranged in the mounting box. Finally, a front opening of the mounting box is covered with a plate serving as a decorated frame. Thus, the operation is completed.

Here, in the printed circuit board, in order that a circuit component is not limited in terms of mounting and a mounting area is maximized, the terminal block is disposed along one side of the printed circuit board. At this time, in consideration of an insulating property for the purpose of preventing contact between the circuit component and the electric wire, an insertion hole is formed in a side wall at one side of a casing, and the electric wire is pulled out through the insertion hole (see JP 2002-170168 A, for example).

However, a creepage distance (clearance) from the terminal block to the insertion hole as an outside of the casing is set to be short, and hence the insulating property may be adversely affected. At this time, in order to separate the entire side wall on the terminal block side of the casing from the terminal block, it is necessary to increase an entire size of the casing. As a result, there arises a problem in that a resin (material) amount of the casing is increased and an operation of arrangement into the mounting box is difficult.

SUMMARY OF THE INVENTION

The present invention has been made to solve the above-mentioned problem, and it is an object of the present invention to obtain a fire alarm system transmitter having an improved insulating property without increasing an entire size of a casing.

According to the present invention, a fire alarm system transmitter includes: a printed circuit board with a substantially rectangular shape, on which a terminal block including a plurality of terminals aligned along one side of the printed circuit board is disposed; a casing with a substantially rectangular parallelepiped shape, in which the printed circuit board is mounted; and an electric-wire insertion portion provided on a side wall of the casing facing the one side, and extended from the side wall by a predetermined distance toward an outside of the casing, the side wall allowing a plurality of electric wires connected to the plurality of terminals to be inserted through the side wall.

The fire alarm system transmitter according to the present invention includes the electric-wire insertion portion extended toward the outside of the casing from the side wall of the casing facing the one side at which the terminal block of the printed circuit board is mounted, and hence a distance from the terminal block to the end of the casing is elongated by a length of the electric-wire insertion portion. As a result, it is possible to obtain an effect of securing a sufficient external creepage distance.

DETAILED DESCRIPTION OF THE PREFERRED EMBODIMENT

Hereinafter, a preferred embodiment of a fire alarm system transmitter according to the present invention is described with reference to the drawings.

Figure 1:
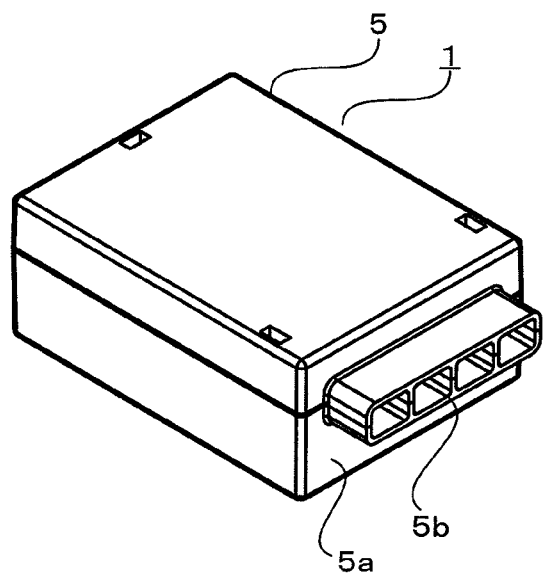
FIG. 1 is a perspective view of a fire alarm system transmitter according to an embodiment of the present invention.
Figure 2:
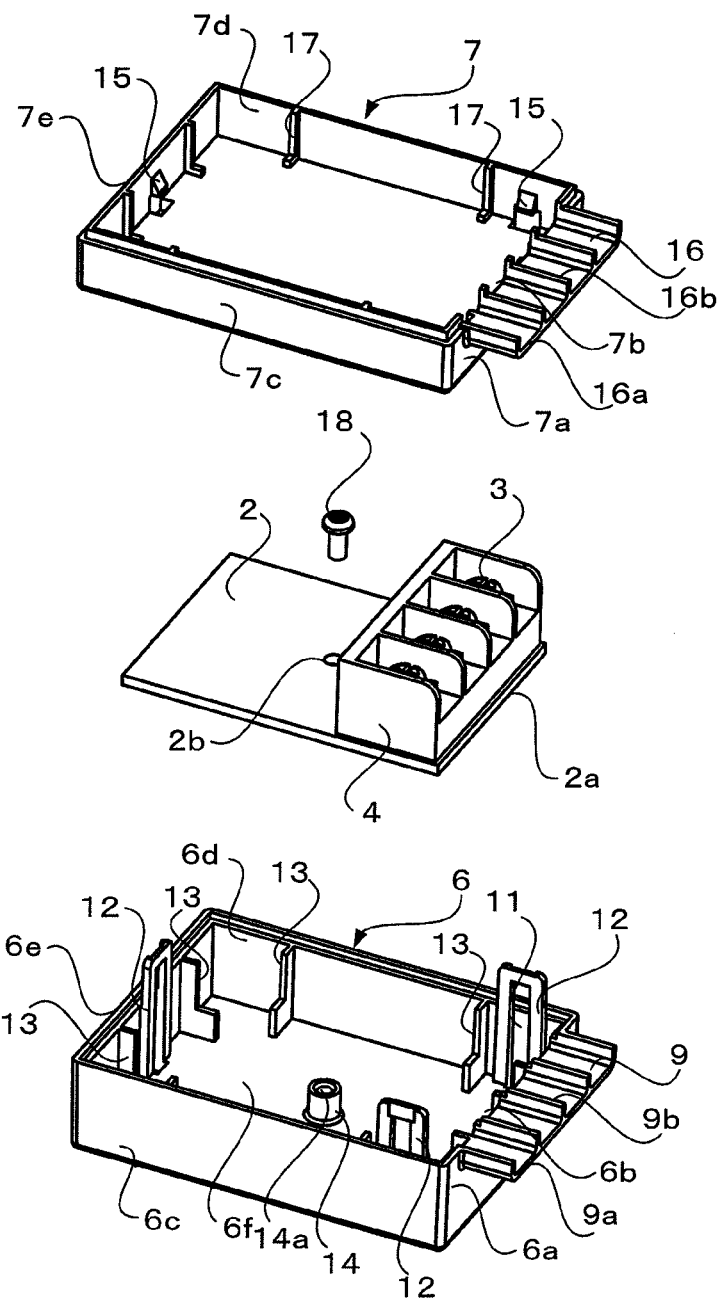
FIG. 2 is an exploded perspective view of the fire alarm system transmitter according to the embodiment of the present invention.
Figure 3:
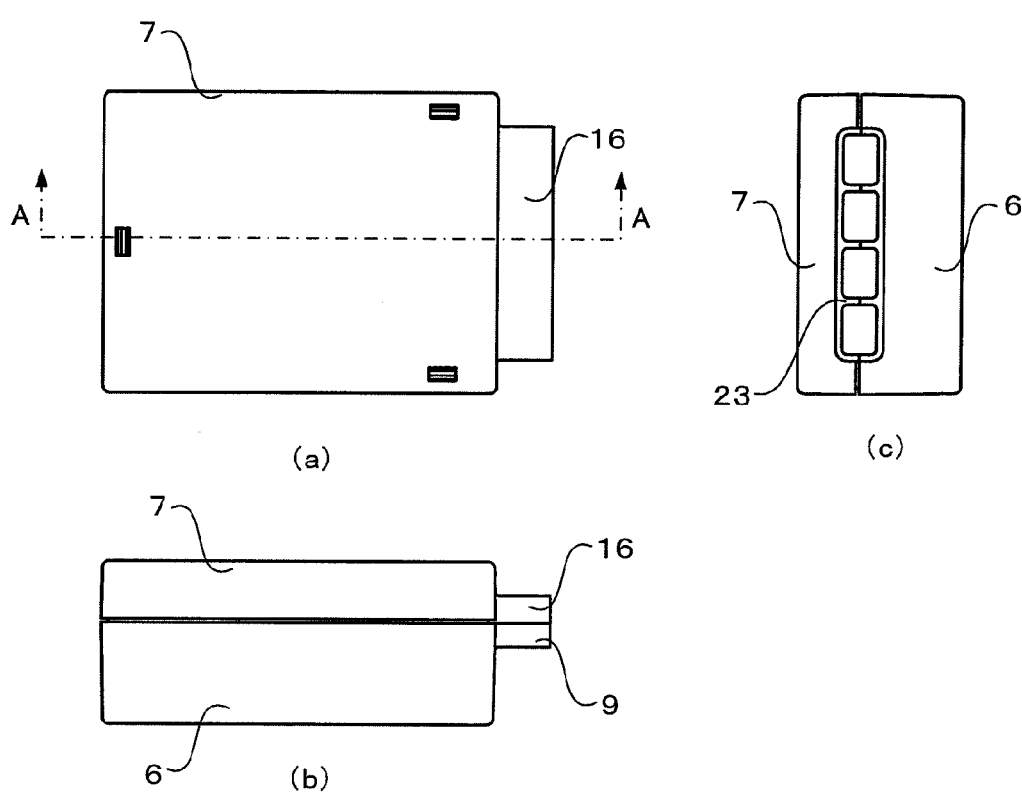
FIGS. 3A to 3C are respectively a front view, a plan view, and a side view of the fire alarm system transmitter according to the embodiment of the present invention.
Figure 4:
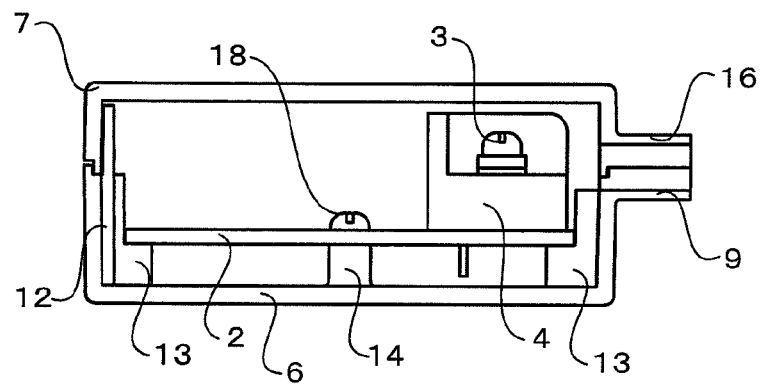
FIG. 4 is a sectional view of the fire alarm system transmitter according to the embodiment of the present invention.

FIG. 1 is a perspective view of the fire alarm system transmitter according to the embodiment of the present invention. FIG. 2 is an exploded perspective view of the fire alarm system transmitter according to the embodiment of the present invention. FIGS. 3A to 3C are respectively a front view, a plan view, and a side view of the fire alarm system transmitter according to the embodiment of the present invention. FIG. 4 is a sectional view of the fire alarm system transmitter taken along the line A-A of FIG. 3A.

A fire alarm system transmitter 1 according to the embodiment of the present invention (hereinafter, abbreviated to transmitter 1) relays a signal between a receiver and a detector, for example. The transmitter 1 includes a printed circuit board 2 with a substantially rectangular shape, on which a terminal block 4 including a plurality of terminals 3 aligned along one side 2a is disposed, and includes a casing 5 with a substantially rectangular parallelepiped shape, in which the printed circuit board 2 is mounted.

On a side wall 5a of the casing 5, there is provided an electric-wire insertion portion 5b through which electric wires connected to the terminals 3 are guided.

The casing 5 includes a lower case 6 having an opened upper surface and an upper case 7 having an opened lower surface.

A plurality of substantially semi-circular cutouts 6b are provided in a top of a side wall 6a of the lower case 6 facing the one side 2a of the printed circuit board 2. The cutouts 6b are provided so as to correspond to the number of the terminals 3 of the terminal block 4. A lower guide 9 is extended substantially upright from an outer edge of the side wall 6a situated around the cutouts 6b. The lower guide 9 has a substantially comb-like cross-section. In the cross-section of the lower guide 9, a plurality of substantially semi-circular portions corresponding to the plurality of cutouts 6b are cut out along one side of a rectangle. In other words, the lower guide 9 includes a bottom wall 9a provided upright from the side wall 6a over a lateral direction of the side wall 6a, and a plurality of division walls 9b provided upright from the bottom wall 9a toward the top of the side wall 6a, to thereby form the cutouts 6b corresponding to the terminals 3.

Further, at the residual top (on the side wall 6a side of the division walls 9b) of the side wall 6a after forming the cutouts 6b, at tops of two side walls 6c and 6d provided continuously with the side wall 6a, and at a top of a side wall 6e opposing the side wall 6a, a recessed stepped portion is formed inwardly in a wall thickness direction of the side walls 6a, 6c, 6d, and 6e.

Further, two engagement tongue pieces 12 are provided on the one side 2a (lower guide 9) side of the side walls 6c and 6d, and one engagement tongue piece 12 is provided at substantially the center of the side wall 6e. Each of the engagement tongue pieces 12 is protruded toward an upper portion of the casing 5 from an inner wall of each of the side walls 6c, 6d, and 6e, and includes an engagement hole 11 formed therein.

Further, L-shaped board seats 13 and a mounting seat 14 are provided. The board seats 13 are extended inwardly from the side walls 6a, 6c, 6d, and 6e. The mounting seat 14 is protruded toward the upper portion of the casing 5 from a position of a bottom wall 6f corresponding to a screw hole 2b formed at the center of the printed circuit board 2, and includes a screw hole 14a formed therein.

A plurality of substantially semi-circular cutouts 7b are provided in a top of a side wall 7a of the upper case 7 facing the one side 2a of the printed circuit board 2. The cutouts 7b are provided so as to correspond to the number of the terminals 3 of the terminal block 4. An upper guide 16 is extended substantially upright from an outer edge of the side wall 7a situated around the cutouts 7b. The upper guide 16 has a substantially comb-like cross-section. In the cross-section of the upper guide 16, a plurality of substantially semi-circular portions corresponding to the plurality of cutouts 7b are cut out along one side of a rectangle. In other words, the upper guide 16 includes a bottom wall 16a provided upright from the side wall 7a over a lateral direction of the side wall 7a, and a plurality of division walls 16b provided upright from the bottom wall 16a toward the top of the side wall 7a, to thereby form the cutouts 7b corresponding to the terminals 3.

Further, at the residual top (on the side wall 7a side of the division walls 16b) of the side wall 7a after forming the cutouts 7b, at tops of two side walls 7c and 7d provided continuously with the side wall 7a, and at a top of a side wall 7e opposing the side wall 7a, a recessed stepped portion is formed outwardly in the wall thickness direction of the side walls 7a, 7c, 7d, and 7e.

Further, two engagement protrusions 15 are provided on the one side 2a (upper guide 16) side of the side walls 7c and 7d, and one engagement protrusion 15 is provided at substantially the center of the side wall 7e. The engagement protrusions 15 are provided on the inner wall side of the side walls 7c, 7d, and 7e, and are engaged with the engagement tongue pieces 12 provided on the side walls 6c, 6d, and 6e when the upper case 7 is fitted to the lower case 6.

Further, L-shaped seats 17 extended inwardly from the side walls 7a, 7c, 7d, and 7e are provided.

The side wall 5a of the casing 5 is constituted by the side wall 6a of the lower case 6 and the side wall 7a of the upper case 7. Further, a plurality of insertion holes are formed in the side wall 5a of the casing 5 so as to correspond to the terminals 3, respectively. Each of the insertion holes is constituted by one of the cutouts 6b of the lower case 6 and corresponding one of the cutouts 7b of the upper case 7. Further, the electric-wire insertion portion 5b extended from the side wall 5a of the casing 5 is formed into a substantially multi-channel shape in cross-section. The lower guide 9 of the lower case 6 and the upper guide 16 of the upper case 7 are fitted to each other so that the substantially semi-circular cutout portions of the lower guide 9 of the lower case 6 and the substantially semi-circular cutout portions of the upper guide 16 of the upper case 7 are fitted to each other to form substantially circular cutout portions. That is, in the electric-wire insertion portion 5b, an insertion hole is partitioned from another insertion hole by a partition wall 23 formed through fitting the division wall 9b and the division wall 16b to each other and by another partition wall 23 adjacent to the former partition wall 23. The partition walls 23 can prevent an electric wire 21 (see FIG. 5) connected to one of the terminals 3 from being held in contact with another adjacent electric wire 21. Therefore, it is possible to achieve protection against an adverse effect such as noises and the like generated due to interference.

Figure 5:
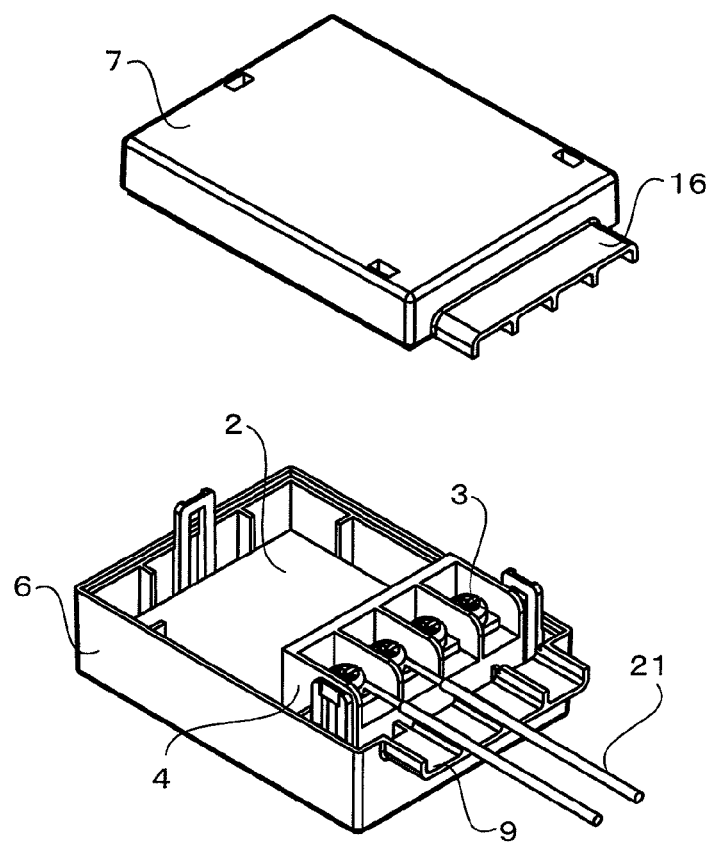
FIG. 5 is a view illustrating a state in which electric wires are connected to the fire alarm system transmitter.
Figure 6:
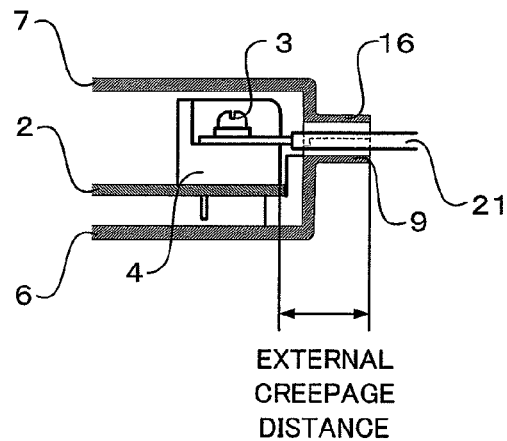
FIG. 6 is an explanatory diagram illustrating a state in which an external creepage distance is elongated.
Figure 7:
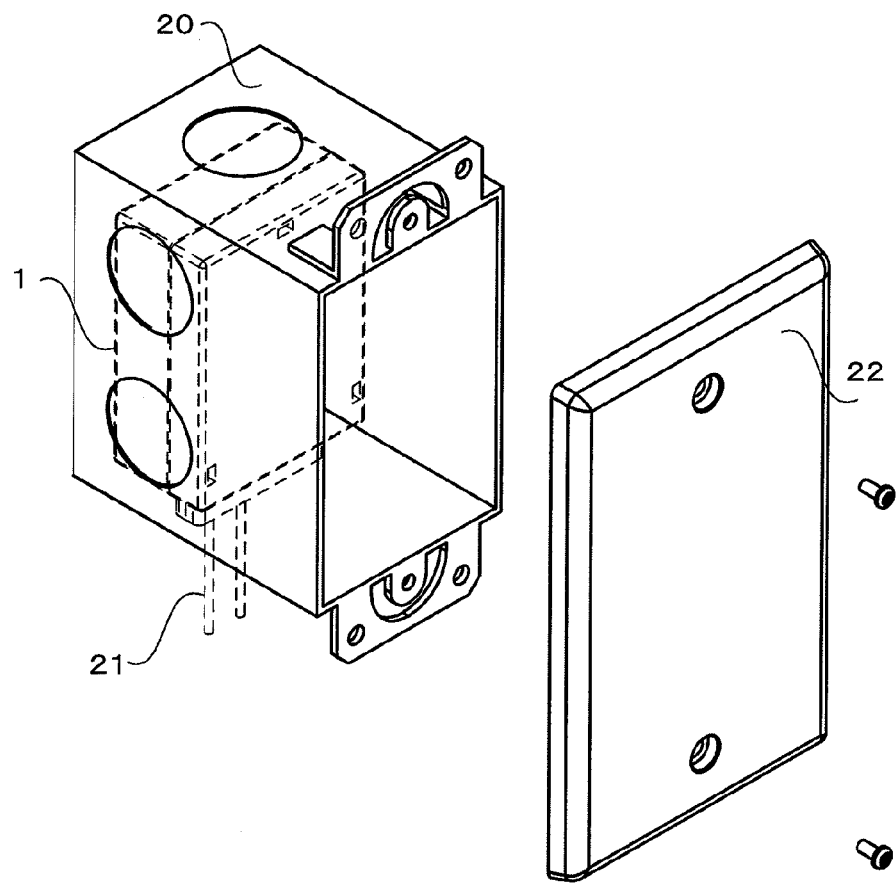
FIG. 7 is an explanatory diagram illustrating a state in which the fire alarm system transmitter is mounted in a mounting box.

Next, the procedure for mounting the transmitter 1 according to this embodiment of the present invention to a mounting box 20 is described. FIG. 5 is a view illustrating a state in which the electric wires 21 are connected to the transmitter 1. FIG. 6 is an explanatory diagram illustrating a state in which an external creepage distance is elongated. FIG. 7 is an explanatory diagram illustrating a state in which the transmitter 1 is mounted in the mounting box 20.

The terminal block 4 is mounted on the printed circuit board 2 through soldering the terminals 3 onto the printed circuit board 2.

Next, the printed circuit board 2 is arranged on the board seats 13, and is fixed with a screw 18 after the screw hole 2b of the printed circuit board 2 is aligned with the screw hole 14a of the mounting seat 14 of the lower case 6. At this time, the printed circuit board 2 is almost held in contact with the lower case 6 and is mounted in the lower case 6.

Next, insulating films are peeled off from end portions of the electric wires 21 extended to an inside of the mounting box 20, and wires are connected to the terminals 3.

Next, the upper case 7 is placed to cover the lower case 6, to thereby form the casing 5. Then, the engagement protrusions 15 are engaged with the engagement holes 11 of the engagement tongue pieces 12 so that the upper case 7 and the lower case 6 are fixed to each other.

Finally, the transmitter 1 is housed together with the electric wires 21 in the mounting box 20 of a type embedded in a wall surface, and a decorated plate 22 is fixed with a screw so as to cover a front opening of the mounting box 20.

The transmitter 1 according to this embodiment of the present invention includes the electric-wire insertion portion 5b which is extended outwardly from the side wall of the casing 5 facing the one side 2a mounted with the terminal block 4 of the printed circuit board 2, and hence a distance from the terminal block 4 to the end of the casing 5 is elongated by a length of the electric-wire insertion portion 5b. As a result, it is possible to secure a sufficient external creepage distance.

Further, the lower case 6 and the upper case 7 are stopped from moving in a horizontal direction owing to the stepped portions provided at the top of the lower case 6 and the top of the upper case 7. Thus, even in a case where the electric-wire insertion portion 5b is provided, the lower case 6 and the upper case 7 are prevented from being separated from each other in the horizontal direction even when an external impact or the like is applied to the lower case 6 and the upper case 7.

Further, the engagement protrusions 15 of the upper case 7 are engaged with the engagement holes 11 of the engagement tongue pieces 12 of the lower case 6, and hence the lower case 6 and the upper case 7 are prevented from being separated from each other in an up-down direction even when the external impact or the like is applied to the lower case 6 and the upper case 7.

Further, the stepped portion provided at upper end portions of the side walls 6a, 6c, 6d, and 6e of the lower case 6 is recessed on an inner side of the stepped portion. Thus, an entire length of each of the engagement tongue pieces 12 can be elongated, and the engagement tongue pieces 12 can be easily deformed and engaged with the upper case 7. Note that, the stepped portion recessed on the inner side thereof may be provided in the upper case 7, and the stepped portion recessed on an outer side thereof may be provided in the lower case 6.

Note that, grooves provided in the lower guide 9 and the upper guide 16 constituting the electric-wire insertion portion 5*b* have the substantially semi-circular cross-sections. However, as long as the grooves have shapes capable of guiding the electric wires, shapes of the grooves are not limited thereto. Further, the insertion holes are formed so as to correspond to the terminals 3, respectively. However, one insertion hole corresponding to all of the terminals 3 may be formed.

Further, though the number of the engagement tongue pieces 12 is three, the number of the engagement tongue pieces 12 is not limited thereto.

What is claimed is:

1. A fire alarm system transmitter, comprising:
    a printed circuit board with a substantially rectangular shape;
    a terminal block disposed along one side of the printed circuit board, the terminal block including a plurality of terminals aligned along the one side of the printed circuit board;
    a casing with a substantially rectangular parallelepiped shape, the printed circuit board being connected and mounted substantially within the casing; and
    an electric-wire insertion portion provided on a side wall of the casing facing the one side of the printed circuit board, the electric-wire insertion portion being extended from the side wall of the casing by a predetermined distance only toward an outside of the casing, and not being extendable from the side wall toward an inside of the casing,
    wherein the electric-wire insertion portion defines a plurality of insertion holes which allow a plurality of electric wires, connected to the plurality of terminals, to be partitioned and inserted through the side wall, and
    wherein the plurality of terminals are substantially connected interiorly of the side wall, and
    the plurality of electric wires are extended to an inside of the casing, and end portions of the plurality of electric wires, from which insulating films are peeled off, are connected directly to the terminals,
    wherein the casing comprises a lower case having an opened upper surface and an upper case having an opened lower surface,
    wherein the electric-wire insertion portion comprises a lower guide extended toward the outside of the casing from a side wall of the lower case facing the one side, and an upper guide extended toward the outside of the casing from a side wall of the upper case facing the one side, and
    wherein a stepped portion for stopping mutual horizontal movement of the lower case and the upper case is provided at each of an upper end portion of side walls of the lower case and a lower end portion of side walls of the upper case.

2. The fire alarm system transmitter according to claim 1, wherein the lower case comprises engagement tongue pieces provided at substantially a center of a side wall opposing the side wall facing the one side and provided on a side of the one side of two side walls which are provided continuously with the side wall facing the one side, the engagement tongue pieces each being protruded from an inner wall of each of the side walls toward an upper portion of the casing and including an engagement hole, and
    wherein the upper case comprises engagement protrusions provided at positions corresponding to the engagement tongue pieces of the lower case, the engagement protrusions each being engaged with the engagement hole.

3. The fire alarm system transmitter according to claim 1, wherein the lower case comprises L-shaped board seats extended inwardly from four side walls, and a mounting seat including a screw hole and being protruded toward the upper portion of the casing from a position of a bottom wall corresponding to a screw hole formed at a center of the printed circuit board.

4. The fire alarm system transmitter according to claim 2, wherein the lower case comprises L-shaped board seats extended inwardly from four side walls, and a mounting seat including a screw hole and being protruded toward the upper portion of the casing from a position of a bottom wall corresponding to a screw hole formed at a center of the printed circuit board.

* * * * *